United States Patent [19]

Terry et al.

[11] Patent Number: 4,675,713
[45] Date of Patent: Jun. 23, 1987

[54] MOS TRANSISTOR

[75] Inventors: Lewis E. Terry, Phoenix; Emily M. Thompson, Gilbert, both of Ariz.

[73] Assignee: Motorola, Inc., Schaumburg, Ill.

[21] Appl. No.: 764,521

[22] Filed: Aug. 12, 1985

Related U.S. Application Data

[63] Continuation of Ser. No. 376,814, May 10, 1982.

[51] Int. Cl.[4] .................. H01L 29/78; H01L 29/56
[52] U.S. Cl. .................................. 357/23.1; 357/23.8;
357/15; 357/67; 357/71
[58] Field of Search .............. 357/23.1, 23.8, 67 S,
357/71 S, 15

[56] References Cited

U.S. PATENT DOCUMENTS

| 3,349,297 | 10/1967 | Crowell et al. | 357/15 |
|---|---|---|---|
| 3,365,793 | 1/1968 | Nechtow | 357/65 |
| 3,544,864 | 12/1970 | Richman | 357/58 |
| 3,841,904 | 10/1974 | Chiang | 357/15 |
| 4,271,424 | 6/1981 | Inayoshi et al. | 357/86 |
| 4,300,152 | 11/1981 | Lepselter | 357/42 |
| 4,324,038 | 4/1982 | Chang et al. | 357/65 |
| 4,336,550 | 6/1982 | Medwin | 357/15 |
| 4,376,286 | 3/1983 | Lidow et al. | 357/23.8 |
| 4,394,673 | 7/1983 | Thompson et al. | 357/15 |
| 4,458,261 | 7/1984 | Omura | 357/23.1 |
| 4,516,143 | 5/1983 | Love | 357/23.4 |

FOREIGN PATENT DOCUMENTS

| 56-81972 | 7/1981 | Japan | 357/23 R |
|---|---|---|---|
| 2103419 | 2/1983 | United Kingdom | 357/23.4 |

OTHER PUBLICATIONS

Murarka, *J. Vac. Sci. Tech.*, 17(4), Jul./Aug. 1980, pp. 776-792, "Refractory Silicides for Integrated Circuits".

*Primary Examiner*—Andrew J. James
*Assistant Examiner*—Jerome Jackson
*Attorney, Agent, or Firm*—Joe E. Barbee; John A. Fisher

[57] ABSTRACT

An improved MOS transistor and method for making that transistor are provided. The improved transistor is characterized by decreased size, improved switching speed, and improved reliability in inductive load use. The improved structure is achieved through the use of a low minority carrier injecting source region formed, for example, by providing a low barrier height metal silicide. The metal silicide source provides a source of majority carriers but little minority carrier injection and hence little parasitic bipolar transistor action.

9 Claims, 9 Drawing Figures

MOS TRANSISTOR

This application is a continuation of application Ser. No. 376,814, filed May 10, 1982.

BACKGROUND OF THE INVENTION

This invention relates, in general, to MOS transistors, and more particularly, to MOS transistors having a source characterized by low barrier height and low minority carrier injection.

A conventional MOS transistor includes spaced apart source and drain regions formed in a body of semiconductor material. The surface of the semiconductor body between the source and drain regions forms the channel of the transistor. The conductivity of the channel is modulated by the potential on a gate electrode which overlies but is insulated from the semiconductor body. In an N channel MOS transistor, for example, the body of semiconductor material is P type and the source and drain regions are N type regions formed in the body, typically by diffusion, ion implantation, or the like. So formed, the source and drain regions form rectifying PN junctions with the semiconductor body. The term "MOS transistor" is herein used to mean any of the insulated gate field effect transistors regardless of the material used for the gate electrode or gate insulator.

In addition to functioning as a normal MOS transistor, this structure also functions as a particular bippolar transistor with the source, body or channel, and drain functionimg as emittter, base, and collector, respectively. The parasitic bipolar transistor can have adverse effects on the operation of the MOS transistor. If the emitter-base junction of the parasitic bipolar transistor is forwad biased so that the parasiic transistor becomes operative, this can have two undesirable effects on the operation of the MOS transistor. First, the operation of the parasitic bipolar transistor results in the injection of minority carriers into the base of the parasitic device from the emitter. In order to turn off the combination of MOS transistor and parasitic bipolar transistor it is then necessary to sweep these minority carriers out of the base region before the combination of devices is effectively turned off. The time required for sweeping out these minority carriers adversely affects the switching speed of the MOS transistor. The MOS transistor, being a majority carrier device, is generally considered to have an inherently fast switching speed, but the presence of the parasitic bipolar transistor degrades the switching performance so that the inherent speed is not achieved.

Second, the presence of the parasitic bipolar transistor in parallel with the MOS transistor also adversely affects the breakdown performance of the device, especially when the device is used with an inductive load. If the bipolar transistor turns on, the breakdown of the two devices in parallel is dominated by the breakdown of the bipolar transistor in the $BV_{CEO}$ mode. This breakdown is normally much lower than the drain to source breakdown of the MOS transistor, $BV_{DSS}$. The breakdown voltage problem is especially severe when switching inductive loads, and results in a degradation of safe operating area (SOA) of the device. $BV_{CEO}$ of the bipolar transistor is inversely proportional to the beta of the transistor. Unfortunately, the beta of the parasitic transistor is likely to be quite high, especially with short channel MOS transistors, because of the small amount of doping in the channel region or parasitic base region. Beta cannot easily be reduced to improve on the breakdown problem; beta is dependent upon doping, but the threshold voltage of the MOS transistor is also dependent on this doping and threshold voltage must be controlled to meet the operating requirements of the device. Beta, and thus the $BV_{CEO}$ of the parasitic transistor, therefore cannot be arbitrarily controlled by altering the doping characteristics of the device.

In an attempt to counter these adverse effects, in operating the MOS transistor the source-body potential is controlled and is typically maintained at zero volts. That is, the source and body are electrically shorted together in order to short the emitter and base thereby disabling the parasitic transistor. Because of current flowing through the body or channel of the MOS transistor, however, an internal bias is generated within the device which may be sufficient to forward bias the emitter-base junction of the parasitic transistor despite the intended short circuit.

In some MOS transistors the body of the device is contacted on the back surface of the semiconductor chip. In other devices, such as diffused channel MOS transistors, the body and channel regions are diffused into the top surface of the semiconductor wafer and the source region is then formed within the diffused region. An electrical short between source and channel or body must then be effected on the top surface of the device by metal overlapping the source and body. This usually requires an additional heavily doped contact diffusion to insure good ohmic contact between the metal and the diffused body. The use of a contact diffusion requires additional space and, therefore, decreases the density of MOS transistors that can be achieved. This loss in density is in addition to the above mentioned problems with a parasitic bipolar transistor formed in parallel with the intended MOS transistor.

In view of the foregoing, it is apparent that it would be desirable to provide an improved MOS transistor and method for making that transistor which would overcome the above related and other problems.

Accordingly, it is an object of the present invention to provide an improved MOS transistor having increased switching speeds.

It is another object of this invention to provide an improved MOS transistor having improved safe operating area.

It is yet another object of this invention to provide an improved and higher density MOS transistor.

It is still another object of this invention to provide an improved method for forming an MOS transistor.

BRIEF SUMMARY OF THE INVENTION

The foregoing and other objects are achieved in the present invention through the fabrication of an MOS transistor having a source region which provides majority carriers for device operation with little minority carrier injection and has a low barrier height with respect to the body material. In one embodiment of the invention, a metal silicide source provides both a source of majority carriers to the channel and at the same time provides an ohmic contact to the device body with little minority carrier injection.

DETAILED DESCRIPTION OF PREFERRED EMBODIMENTS

Figure 1:
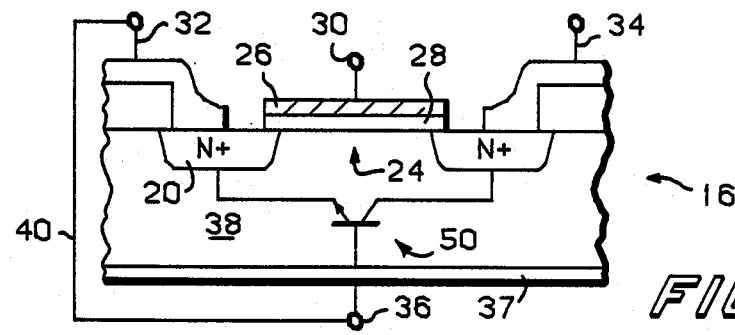
FIGS. 1 and 2 illustrate conventional MOS transistors.
Figure 2:
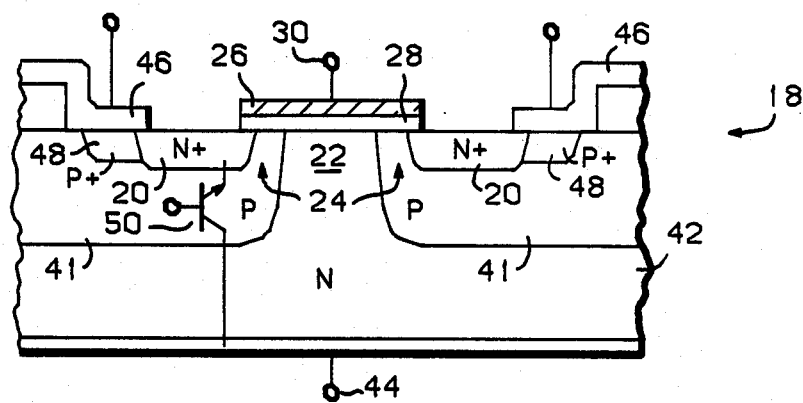

FIGS. 1 and 2 illustrate, in cross section, the structure of a conventional MOS transistor and a diffused channel MOS transistor, respectively. The devices illustrated are N channel devices, but the following discussion applies equally to N or P channel devices. The devices include a source 20 and drain 22 spaced apart and separated by a channel region 24 of opposite conductivity type. Overlying the channel is a gate electrode 26 insulated from the channel by a gate insulator 28. Current flow between the source and drain is controlled by modulating the conductivity of the channel region by applying gate potentials to the gate electrode through a gate terminal 30.

In FIG. 1 electrical contact is made to source 20 and drain 22 through source and drain terminals 32 and 34, respectively. A body terminal 36 makes electrical contact to metallization 37 on one surface of semiconductor body 38 in which source and drain regions are formed and, through the resistance of body 38, to the channel 24. In normal operation, the potential of the semiconductor body is controlled through terminal 36. Especially in applications of discrete MOS transistors, the source and body are often shorted together as by the electrical interconnection 40 between terminals 32 and 36.

The diffused channel MOS transistor illustrated in FIG. 2 is of the type in which contact to the drain region 22 is made from the back side of the semiconductor device, but similar arguments apply to diffused channel transistors in which the drain contact is on the same side of the wafer as are the contacts to the source and gate. Channel regions 24 are formed by diffusing P type body regions 41 into selected portions of the surface of an N type wafer 42. Source regions 20 are then formed by diffusing a heavily doped N+ region into the P type body region to form a rectifying N+P junction. Channel region 24 is the surface portion of body region 41 located between source and drain and controlled by potential on gate electrode 26. In the embodiment illustrated, the total MOS transistor is formed from a plurality of diffused channels 24 and sources 20 operated in parallel with device current being collected through a single drain terminal 44 making electrical contact to the drain 22. To control the potential in the body, metallization 46 making contact to the source region is patterned to also make contact to the P type channel material. Placing the source metal 46 in such manner effectively shorts source 20 and body 41 together in a manner similar to that done by the innerconnection 40 in FIG. 1. The diffused channel region is lightly doped to provide a desirably low threshold voltage; because of the light surface doping it is difficult to make good ohmic contact to the P region. An additional heavily doped P+ region 48 is therefore required to insure that a low resistance ohmic contact is made to the P type body region.

In each of the devices illustrated in FIGS. 1 and 2 a parasitic bipolar transistor 50 exists in parallel with the intended MOS transistor. The emitter, base, and collector of transistor 50 are formed by the source, body, and drain, respectively, of the MOS transistor. The placing of an electrical short between the source and channel or source and body of the MOS transistor is an attempt to disable this parasitic bipolar transistor by shorting together the base and emitter of the device. Because of resistance internal to the devices, however, this shorting effort is not entirely satisfactory. In transistor 16, for example, a resistance exists through the bulk material 38 between contact 36 and the effective emitter base junction. Similarly, in transistor 18 a resistance exists through the diffused P region between the ohmic contact to P+ region 48 and the operative emitter base junction. Current flow through this resistor during normal operation of the MOS transistor can cause forward biasing of the emitter-base junction despite the intended short.

Figure 3:
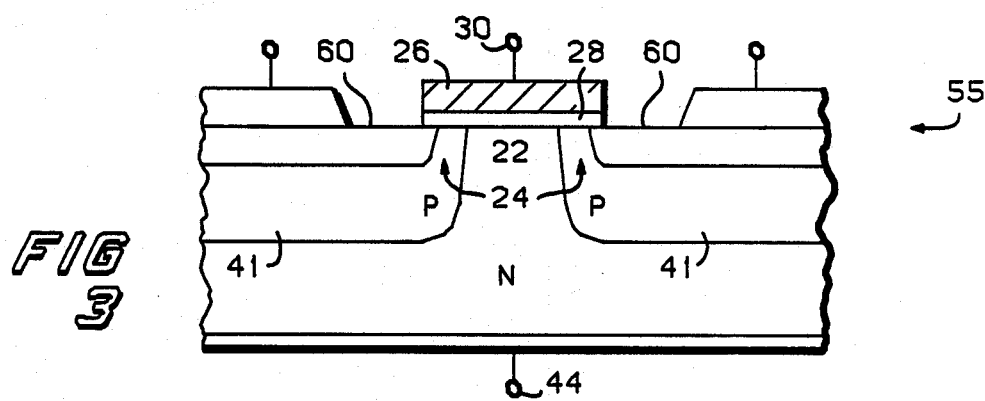
FIG. 3 illustrates an MOS transistor in accordance with the invention.

FIG. 3 illustrates an improved MOS transistor 55 in accordance with the invention which overcomes the above noted difficulties of conventional MOS transistors. In addition, the improved transistor allows the fabrication of higher density devices. Transistor 55 is an N channel MOS transistor of the diffused channel type, but the invention is equally applicable to N or P channel devices whether the channel is diffused or not.

In a structure similar to that of device 18, transistor 55 includes a plurality of diffused P type body regions 41 having channel regions 24 formed at the surface of the P type body regions adjacent an N type drain region 22. Overlying the channel is a gate insulator 28 and a gate electrode 26. Potential on the gate electrode is controlled through a gate terminal 30. Source-drain current flows through N type drain region 22 and is collected at drain contact 44.

In accordance with the invention, source regions 60 of the device are formed, not by diffused N type regions, but by a low minority carrier injecting metal having a low barrier height with respect to the P type channel region. In one embodiment of the invention, source region 60 is formed of a metal silicide wherein the silicide is selected to have a low barrier height with little minority carrier injection. Source region 60 can be formed on P type body 41, for example, by forming a region of platinum silicide, rubidium silicide, iridium silicide, or tungsten silicide. Such silicides have a low barrier height and thus form a good contact to the P doped body region, provide majority carriers for current conduction through the channel region, but are characterized by low minority carrier injection. Because the silicide makes good electrical contact to the diffused P region, an additional heavily doped P+ contact region is not required. Most importantly, however, the low minority carrier injection results in the region being a poor emitter of the parasitic bipolar transistor; the parasitic bipolar transistor, therefore, has low gain and can be neglected as a breakdown voltage determining element. Additionally, because of the low injection, there are few carriers to sweep out during a switching operation and the inherently high switching speeds of MOS transistors are achieved.

The total current injected by the source region into the body or channel region includes both minority and majority carriers. For a device in accordance with the invention having low minority carrier injection, the ratio of minority to majority carriers injected is limited to about 25% and preferably to about 10% or less of that characteristic of an N+P junction. The low ratio of minority to majority carriers is achieved by a metal-silicon contact having a low barrier height. The barrier height of a metal-silicon contact is determined by the work function difference between the metal and the silicon. For a given metal the sum of the barrier height for metal-N type silicon and metal-P type silicon is equal to the silicon energy gap, or about 1.1 ev. Most metals have a high barrier height (0.65 to 0.85 ev) on N type silicon and a correspondingly low barrier height (0.25–0.45 ev) on P type silicon. Preferably, for devices in accordance with the invention, the barrier height is less than about 0.30 ev. The low barrier height insures good contact between the metal and the body and eliminates the need for a heavily diffused contact region.

FIGS. 4–9 illustrate one process for the fabrication of devices in accordance with the invention. In this illustrative embodiment an N channel device of the diffused channel type is depicted. Those skilled in the art will appreciate that the invention can also be applied, for example, to P channel devices and to devices having an undiffused channel region. It will further be appreciated that in certain process steps the processes of ion implantation and thermal diffusion are interchangeable and that insulating layers can be formed by thermal oxidation, chemical vapor deposition, and the like. With respect to these and other processing steps well known to be generally equivalent, it is intended that the invention not be limited to any one particular choice of such alternatives.

Figure 4:
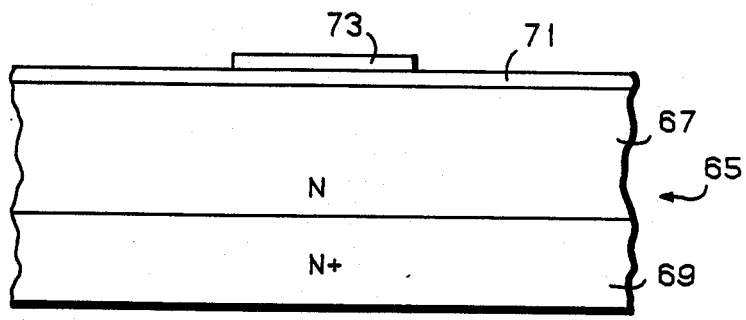
FIGS. 4–9 illustrate process steps for the fabrication of an MOS transistor in accordance with the invention.

FIG. 4 illustrates a portion of a semiconductor wafer 65 in which a diffused channel MOS transistor in accordance with the invention is to be fabricated. Thick field oxide regions, well known in the art, have not been shown. Substrate 65 is an N type semiconductor wafer, for example, of silicon. The substrate includes a lightly doped N type region 67 having a doping concentration selected to support the desired breakdown voltage of the device. Substrate 65 may also include a heavily doped N+ region 69 to reduce series resistance through the device. Overlying the surface of N region 67 is a thin layer of gate insulator material 71 such as silicon dioxide or other suitable insulator. Overlying the gate insulator is a patterned gate electrode 73 formed of a material such as doped polycrystalline silicon.

Figure 5:
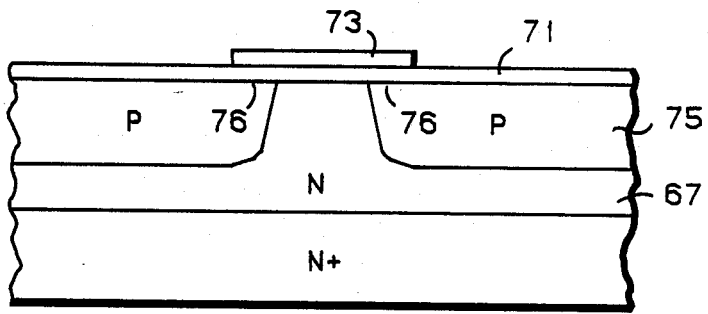

FIG. 5 illustrates the formation of a body region 75. The channel is formed by implanting boron ions or other P type dopant into the surface of N type region 67 using gate electrode 73 as an implant mask. By using ion implantation, a carefully controlled amount of dopant can be implanted into the wafer surface. A subsequent heat treatment thermally redistributes the dopant material forming the body region 75 and the channel region 76 at the surface of the body region. The surface concentration of the channel region is a major determinant of the threshold voltage of the MOS transistor and this is determined in known manner by controlling the implant dose and thermal redistribution.

Figure 6:
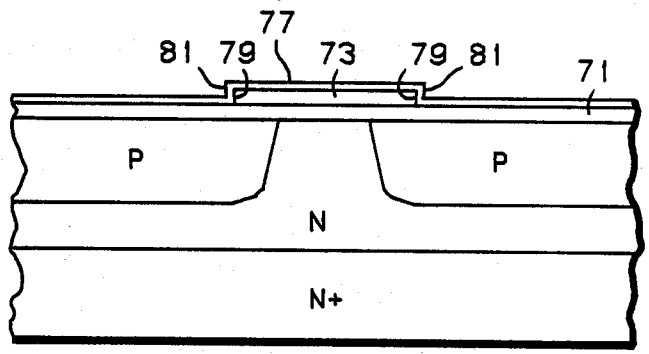

As illustrated in FIG. 6, a masking layer 77, for example silicon dioxide, is formed over the surface of the substrate. It is especially important that edges 79 of the gate electrode be protected by portions 81 of the masking film.

Figure 7:
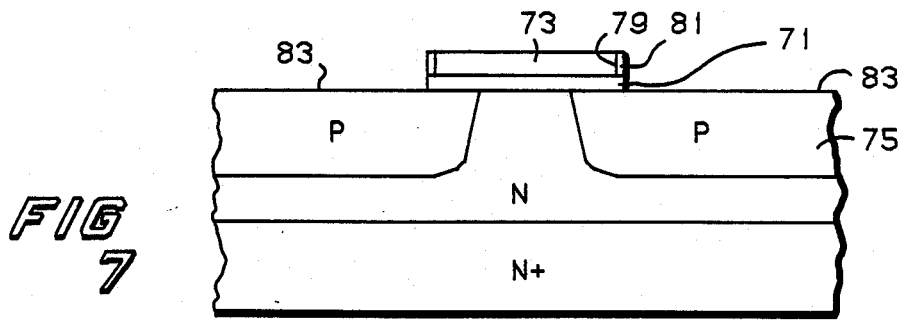

As illustrated in FIG. 7, portions of masking layer 77 and gate insulator 71 are removed to expose surface 83 of the P type body region 75. Patterning of masking layer 77 is done in a manner to insure that portion 81 of the masking layer remains intact covering edges 79 of the gate electrode. The patterning can be accomplished, for example, by reactive ion etching the masking layer. Reactive ion etching is a directionally dependent process in which reactive ions are directed perpendicular to the substrate surface and do not impinge upon or etch sidewall portion 81 positioned on the vertical side of gate electrode 73.

Figure 8:
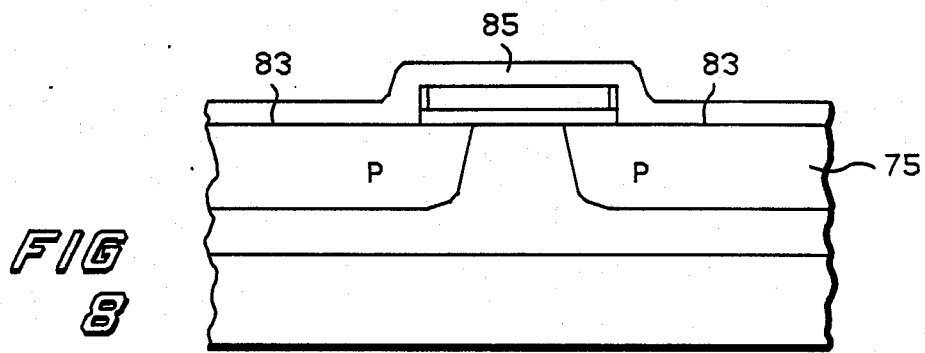

In FIG. 8 a layer of metal 85 having a low barrier height with respect to P type channel region 75 is formed over the surface of the substrate. Layer 85 can be formed, for example, by the sputter deposition of a layer of platinum. Other suitable metals for contacts to a P type region where the contacts are characterized by low barrier height and low minority carrier injection include, for example, rubidium, iridium, and tungsten.

Figure 9:
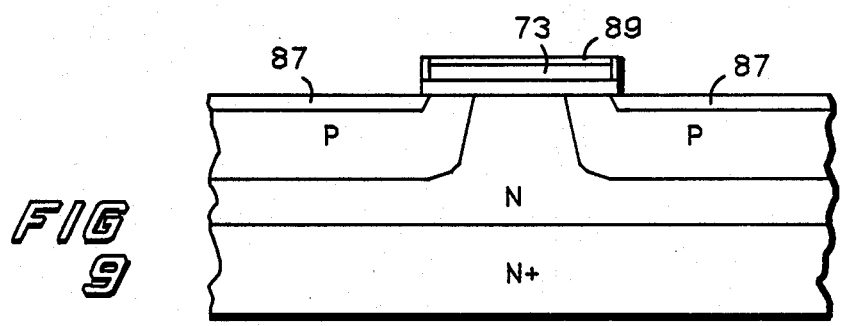

Following the deposition of low barrier height metal 85, the substrate is heated to promote silicide formation between the metal 85 and the P type silicon at surface 83 of body region 75. In the case of platinum, platinum silicide is formed by heating the substrate to a temperature of about 700° C. in a reducing ambient for 15 minutes. Silicide is formed in those locations where the platinum contacts silicon. The silicide formation thus forms source regions 87 and also a low resistance platinum silicide layer 89 atop gate electrode 73 as illustrated in FIG. 9. No silicide forms where the platinum contacts silicon dioxide, for example, on the field oxide and on the mask at the edge of the gate electrode. The platinum can be rinsed off these regions in a suitable etchant without affecting the silicide on other portions of the substrate. Masking layer 81 at the edge of the gate electrode is necessary to prevent any shorting between platinum silicide source 87 and gate electrode 73, especially silicide portion 89 of the gate electrode. This is especially true since a volumetric swelling occurs upon the formation of the silicide and this swelling might otherwise cause shorting between the two transistor regions.

The transistor structure is completed in normal manner, for example, by depositing a layer of insulator over the surface of the device, opening contact windows through that insulator layer, applying electrode material such as aluminum, and patterning the aluminum to form the gate and source electrodes. An electrode material is also applied to the back of the substrate contacting N+ region 69 to serve as the drain contact for the device.

A device in accordance with the invention made as described above is compared to an otherwise similar device fabricated having a diffused source region. Devices are measured to have comparable transconductance, but the device having platinum silicide source regions exhibits greater stability in the breakdown mode without tendency to switch back in a $BV_{CEO}$ mode. A device having platinum silicide source regions is measured to have an improved switching speed when compared to the device having conventional diffused source region.

In this illustrative embodiment, the source regions are formed by depositing platinum and then heating to form platinum silicide. In further embodiments, other metals are deposited in place of the platinum and then heated to form a metal silicide. In yet another embodiment, a metal silicide material is deposited, for example by chemical vapor deposition, to form the source regions. And in yet another embodiment, a metal such as gold is deposited on the semiconductor substrate to form a low barrier height contact without forming a silicide.

Thus it is apparent that there has been provided, in accordance with the invention, an improved MOS transistor and method for making the transistor which fully meets the advantages and objects set forth above. While the invention has been described in relation to certain specific embodiments thereof, it is not intended that the invention be so limited. Other variations and modifications in the invention will be apparent to those skilled in the art after review of the foregoing description. Other low barrier height metals, for example, can be used for the formation of the source region, with or without forming a metal silicide, depending on the metal. Additionally, other processes will be effective in forming particular metal silicides. Accordingly, it is intended to include these and other variations and modifications within the scope of the appended claims.

We claim:

1. An MOS transistor comprising: a semiconductor body of a first conductivity type having a channel region therein; a drain region of opposite conductivity type forming a retifying PN junction with said body; and a source region formed in said body by a metal silicide contacting said body.

2. The MOS transistor of claim 1 wherein said metal silicide is selected to have a low barrier height with respect to said body.

3. The MOS transistor of claim 1 wherein siad body is P type and said metal silicide is selected from the group consisting of platinum silicide, iridium silicide, and tungsten silicide.

4. An MOS transistor comprising: a silicon substrate of first conductivity type including a drain region and havig a surface; a drain electrode coupled to said drain region; a body region of opposite conductivity type formed in said drain region, intersecting said surface, and forming a PN junction with said drain region; a gate insulator overlying a portion of said body region, said portion comprising a channel region; a gate electrode overlying said gate insulator; a source region of metal silicide formed in and contacting said body region at said surface adjacent said channel region; and a source electrode coupled to said source region.

5. The MOS transistor of claim 4 wherein said gate electrode comprises polycrystalline silicon.

6. The MOS transistor of claim 5 wherein said metal silicide is also formed on said gate electrode.

7. The MOS transistor of claim 6 further comprising an insulating material electrically separating said gate electrode and said source region.

8. The MOS transistor of claim 4 wherein said source electrode and said drain electrode comprise aluminum.

9. The MOS transistor of claim 4 wherein said silicon substrate further comprises a second surface and said drain electrode is postioned on said second surface.

* * * * *

UNITED STATES PATENT AND TRADEMARK OFFICE
CERTIFICATE OF CORRECTION

PATENT NO. : 4,675,713
DATED : June 23, 1987
INVENTOR(S) : Lewis E. Terry et al.

It is certified that error appears in the above-identified patent and that said Letters Patent is hereby corrected as shown below:

Claim 1, line 4, replace "retifying" by -- rectifying --.

Claim 3, line 1, replace "siad" by -- said --.
Claim 3, line 3, replace "an" by -- and --.
Claim 3, line 4, delete "d".

Claim 4, line 3, replace "havig" by -- having --.

Claim 9, line 3, replace "postioned" by -- positioned --.

Signed and Sealed this

Tenth Day of November, 1987

Attest:

DONALD J. QUIGG

Attesting Officer

Commissioner of Patents and Trademarks